(12) United States Patent
Harris et al.

(10) Patent No.: US 10,809,330 B2
(45) Date of Patent: Oct. 20, 2020

(54) REDUCING MAGNETIC FIELD INSTABILITIES CAUSED BY OSCILLATIONS OF A MECHANICAL CRYO-COOLER IN MAGNETIC RESONANCE SYSTEMS

(71) Applicant: Synaptive Medical (Barbados) Inc., Bridgetown (BB)

(72) Inventors: Chad Tyler Harris, Toronto (CA); Geron Andre Bindseil, Toronto (CA); Alexander Gyles Panther, Toronto (CA); Jeff Alan Stainsby, Toronto (CA); Philip J. Beatty, Toronto (CA)

(73) Assignee: Synaptive Medical (Barbados) Inc., Bridgetown (BB)

( * ) Notice: Subject to any disclaimer, the term of this patent is extended or adjusted under 35 U.S.C. 154(b) by 86 days.

(21) Appl. No.: 16/071,774

(22) PCT Filed: Mar. 9, 2016

(86) PCT No.: PCT/IB2016/051344
§ 371 (c)(1),
(2) Date: Jul. 20, 2018

(87) PCT Pub. No.: WO2017/153805
PCT Pub. Date: Sep. 14, 2017

(65) Prior Publication Data
US 2019/0033403 A1    Jan. 31, 2019

(51) Int. Cl.
*G01R 33/389* (2006.01)
*G01R 33/38* (2006.01)
*G01R 33/421* (2006.01)
*G01R 33/385* (2006.01)
*G01R 33/3875* (2006.01)

(52) U.S. Cl.
CPC ....... *G01R 33/389* (2013.01); *G01R 33/3804* (2013.01); *G01R 33/3856* (2013.01); *G01R 33/3875* (2013.01); *G01R 33/421* (2013.01)

(58) Field of Classification Search
CPC .............. G01R 33/389; G01R 33/3804; G01R 33/3856; G01R 33/3875; G01R 33/421
See application file for complete search history.

(56) References Cited

U.S. PATENT DOCUMENTS

| 5,103,647 A | 4/1992 | Ackermann |
| 7,924,011 B2 | 4/2011 | Aarts |

(Continued)

FOREIGN PATENT DOCUMENTS

| CN | 1493871 | 5/2004 |
| CN | 104062612 | 9/2014 |

(Continued)

OTHER PUBLICATIONS

PCT International Search Report and Written Opinion, PCT/IB2016/051344, dated Jan. 26, 2017, 9 pages.

(Continued)

*Primary Examiner* — Tung X Nguyen
*Assistant Examiner* — Feba Pothen
(74) *Attorney, Agent, or Firm* — Quarles & Brady LLP (57) ABSTRACT

Described here are systems and methods for mitigating or otherwise removing the effects of short-term magnetic field instabilities caused by oscillations of the cold head in a cryogen-free magnet system used for magnetic resonance systems, such as magnetic resonance imaging ("MRI") systems, nuclear magnetic resonance ("NMR") systems, or the like.

9 Claims, 4 Drawing Sheets

(56) References Cited

U.S. PATENT DOCUMENTS

| | | | |
|---|---|---|---|
| 8,593,141 B1 | 11/2013 | Radparvar | |
| 2001/0013778 A1* | 8/2001 | Tsuda | G01R 33/3815 324/307 |
| 2004/0032260 A1* | 2/2004 | Fontius | G01R 33/3815 324/309 |
| 2004/0051530 A1* | 3/2004 | Havens | G01R 33/28 324/318 |
| 2014/0094639 A1* | 4/2014 | Zwart | H05H 13/02 600/1 |
| 2014/0285201 A1* | 9/2014 | Freytag | G01R 33/4215 324/322 |

FOREIGN PATENT DOCUMENTS

| | | |
|---|---|---|
| CN | 104812444 A | 7/2015 |
| EP | 0955555 | 6/2001 |
| JP | H08-191821 | 7/1996 |
| JP | H10-165388 | 6/1998 |
| JP | 2011005091 | 1/2011 |
| JP | 2012520722 | 9/2012 |
| JP | 2016168265 | 9/2016 |

OTHER PUBLICATIONS

Office Action issued by the Japanese Patent Office in relation to corresponding JP Application No. 2018-546809 dated Oct. 28, 2019, 7 pgs. With translation.

Office Action issued by the National Intellectual Property Administration of China in relation to corresponding CN Application No. 2016800833436 dated Jun. 23, 2020, 3 pgs.

Search Report issued by the National Intellectual Property Administration of China in relation to corresponding CN Application No. 2016800833436 dated Jun. 17, 2020, 3 pgs.

* cited by examiner

REDUCING MAGNETIC FIELD INSTABILITIES CAUSED BY OSCILLATIONS OF A MECHANICAL CRYO-COOLER IN MAGNETIC RESONANCE SYSTEMS

CROSS-REFERENCE TO RELATED APPLICATIONS

This application represents the national stage entry of PCT International Application PCT/IB2016/051344, filed Mar. 9, 2016. The contents of this application are hereby incorporated by reference as set forth in their entirety herein.

BACKGROUND OF THE INVENTION

The field of the invention is systems and methods for magnetic resonance. More particularly, the invention relates to systems and methods for reducing magnetic field instabilities caused by oscillations of a mechanical cryocooler in magnetic resonance systems.

Conduction cooled, cryogen-free magnet systems require the cold head (i.e., the source of cooling) to be placed much closer to the magnet windings than in a typical magnet system containing a helium bath. This requirement is because the heat is transferred via conduction along copper and increasing the distance of the cold head from the windings reduces the cooling efficiency significantly. It is also desirable to have the cold head close to the windings in order to reduce the overall size of the system.

There are two types of cold head currently available: Gifford-McMahon ("GM"), which is the most common cold head currently used, and pulse tube. Within both there is a material called the regenerator, this material is responsible for removing the last bits of heat to get down to less than 4 Kelvin (K). The regenerator material is typically composed of an Erbium Nickel compound that becomes magnetized when exposed to an external magnetic field. The amount of magnetization of the material (its magnetic moment) is dependent on both the magnitude of the applied magnetic field as well as its temperature.

In a GM cold head the regenerator material moves up and down at a well-defined frequency, both exposing itself to a variable magnetic field as well as changing temperature throughout the cooling cycle. In a pulse tube cold head the regenerator material does not move, but its temperature will still fluctuate. In both cases, the oscillations and temperature fluctuations cause the regenerator material to act like a tiny magnetic dipole with fluctuating magnitude. In currently available magnetic resonance systems, this generated magnetic dipole has little effect because the cold head is so far away from the imaging region; however, for cryogen-free magnets, this is not the case. The short-term field instability caused by this effect results in image "ghosting."

Thus, there remains a need to provide systems and methods for reducing or otherwise eliminating magnetic field instabilities caused by oscillations of a mechanical cryocooler in magnetic resonance systems.

SUMMARY OF THE INVENTION

The present invention overcomes the aforementioned drawbacks by providing a method for reducing magnetic field instability effects caused by time-varying dipole fields generated by oscillations of a cold head in a mechanical cryocooler in a magnetic resonance system. The method includes determining a spatial profile for the magnetic field instabilities caused by time-varying dipole fields generated by oscillations of the cold head in the mechanical cryocooler. Then, with a computer system and based in part on the determined spatial profile for the magnetic field instabilities, control parameters associated at least one corrective electromagnetic field are determined. This at least one corrective electromagnetic field is determined such that when generated, it will reduce the magnetic field instabilities caused by the time-varying dipole fields generated by oscillations of the cold head in the mechanical cryocooler. A cycle of the mechanical cryocooler is tracked and at a time point determined by the cycle of the mechanical cryocooler, the at least one corrective electromagnetic field is generated, thereby reducing the magnetic field instabilities caused by the time-varying dipole fields generated by oscillations of the cold head in the mechanical cryocooler.

It is another aspect of the present invention to provide a passive compensation coil for reducing magnetic field instabilities caused by time-varying dipole fields oscillating at an oscillation frequency and generated by a mechanical cryocooler that forms a part of a magnetic resonance system. The passive compensation coil generally includes at least one conductive loop composed of a conductive material and positioned proximate a cold head in the mechanical cryocooler, wherein a thickness of the at least one conductive loop is at least one skip depth of the conductive material based on the oscillation frequency at which the time-varying dipole fields oscillate.

It is still another aspect of the invention to provide an active shield for reducing magnetic field instabilities caused by time-varying dipole fields generated by a mechanical cryocooler that forms a part of a magnetic resonance system. The active shield generally includes magnet windings positioned proximate a cold head of the mechanical cryocooler and driven by a controller to generate electromagnetic fields that reduce a magnetic moment of regenerator materials in the cold head, thereby reducing the magnetic field instabilities caused by time-varying dipole fields generated by the mechanical cryocooler.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for mitigating or otherwise removing the effects of short-term magnetic field instabilities caused by oscillations of the cold head in a cryogen-free magnet system used for magnetic resonance systems, such as magnetic resonance imaging ("MRI") systems, nuclear magnetic resonance ("NMR") systems, or the like. In general, such cryogen-free magnet systems include a superconducting magnet cooled by a mechanical cryocooler. The mechanical cryocooler can be a Gifford-McMahon ("GM") cryocooler or a pulse tube cryocooler. Further, pulse tube cryocoolers can include GM-type or Stirling type pulse tube cryocoolers.

The field instabilities caused by a mechanical cryocooler are caused by a time-varying dipole magnetic field at the location of the cold head. In general, these field instabilities have a frequency of oscillation of about 1-1.2 Hz. The systems and methods of the present invention provide techniques for mitigating or otherwise eliminating the deleterious effects of the magnetic field instabilities caused by the time-varying dipole field generated by the mechanical cryocooler.

Figure 1:
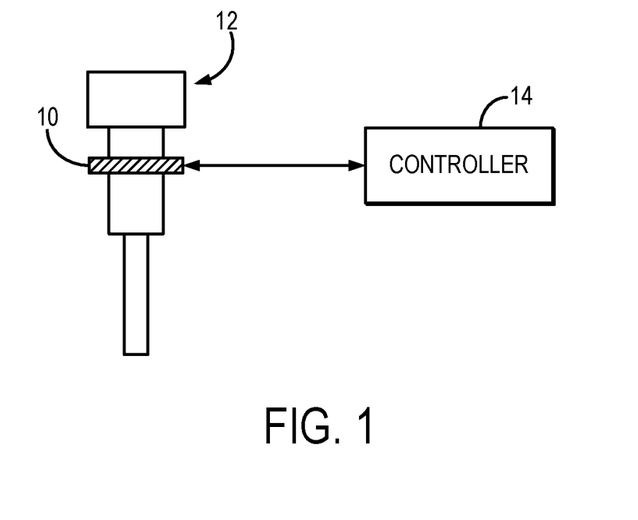
FIG. 1 depicts an example mechanical cryocooler with an actively driven compensation coil for mitigating field instabilities caused by time-varying dipole fields generated by the cold head.

In some embodiments, the field instability caused by a mechanical cryocooler can be mitigated using an actively driven compensation coil. As shown in FIG. 1, the actively driven compensation coil 10 can be positioned proximate the cold head 12 of a mechanical cryocooler. The actively driven compensation coil 10 is driven by a controller 14 according to the methods described below. The actively driven compensation coil 10 can include a specially designed electromagnet, as described below.

As was stated above, the field instability caused by a mechanical cryocooler is caused by a time-varying dipole magnetic field at the location of the cold head. The spatial pattern of the dipole magnetic field can be measured, or simulated, and an electromagnet can be designed based on those measurements or simulations to remove the effects of the time-varying dipole magnetic field. The current supplied to the electromagnet would be selected to oscillate at the same frequency as the field instability, thereby generating a magnetic field that would interfere with and mitigate the field instability. This implementation would require tracking of the cycle of the cold head.

Figure 2:
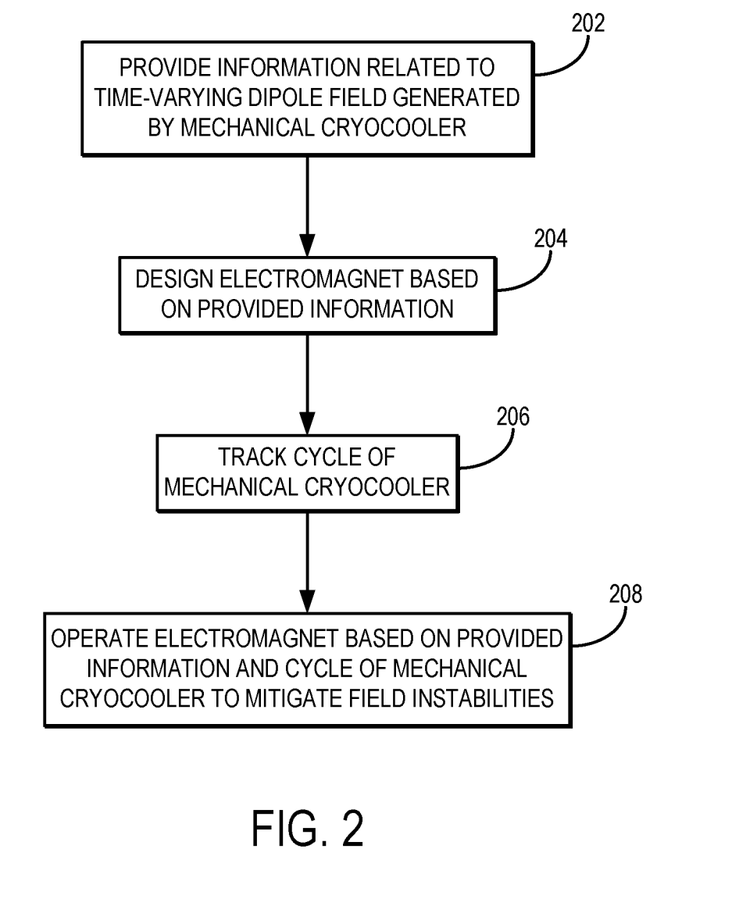
FIG. 2 is a flowchart setting forth the steps of an example method for controlling an actively driven compensation coil to mitigate field instabilities caused by time-varying dipole fields generated by the cold head in a mechanical cryocooler.

Referring now to FIG. 2, a flowchart is illustrated as setting forth the steps of an example method for mitigating the field instability caused by a mechanical cryocooler using an electromagnet that is specifically designed or operated to provide active compensation to cancel or otherwise mitigate the field instability. The method includes providing information related to the time-varying dipole field generated by the mechanical cryocooler, as indicated at step 202. In some instances, this information can be provided by measuring the dipole field generated by the mechanical cryocooler in operation. In some other instances, this information can be provided by simulating the dipole field that should be generated by the mechanical cryocooler in operation. This information can be used to determine corrective electromagnetic fields that, when generated in the proximity of the cold head, will mitigate or otherwise eliminate the magnetic field instabilities caused by the time-varying dipole fields. In some instances, control parameters that define the operation of an electromagnet to generate the corrective electromagnetic fields are determined.

In any event, an electromagnet to mitigate the field instability caused by that dipole field is then designed based on the provided information, as indicated at step 204. The design can include the physical construction of the electromagnet, or can include information, such as the control parameters mentioned above, about how to operate a particular electromagnet to generate the corrective electromagnetic fields to mitigate the field instability. In either instance, it is preferable to track the cycle of the cold head in the mechanical cryocooler. Thus, the cycle of the mechanical cryocooler is tracked, as indicated at step 206. Tracking the cycle of the mechanical cryocooler is done so that operation of the electromagnet can be synchronized with the dipole fields generated by the mechanical cryocooler, thereby increasing the mitigation of the field instability.

As one example, the cycle of the cold head in the mechanical cryocooler can be tracked by measuring the dipole field as a function of time and identifying where in the stability cycle the cryocooler currently is operating. This measurement can be performed, for example, using the magnetic resonance system itself, or with a Hall probe, or the like, that is operably coupled to the cold head. In this instance, the information can be relayed back to the controller for the actively driven compensation coil and used to appropriately drive the coil.

As another example, the motor of the cold head pump can be tracked. The cycle of the motor can then be correlated with the dipole field to provide information about the cycle of the mechanical cryocooler as it relates to the dipole field being generated at a particular point in the cycle. In this instance, the information about the pump motor cycle can be relayed back to the controller for the actively driven compensation coil and used to appropriately drive the coil.

By tracking the cycle of the mechanical cryocooler and providing the information about the dipole field generated by the cryocooler, the electromagnet can be operated in a manner such that a field is generated that mitigates the field instability caused by the mechanical cryocooler, as indicated at step 208. As mentioned above, the electromagnet may be structurally designed to provide greater efficiency in mitigating the field instability; however, in general the electromagnet design can include information about the currents to be provided to the electromagnet that will generate the desired fields to offset the field instability. Thus, using the information provided and obtained, as discussed above, the electromagnet can be operated as an active compensation coil specifically tailored to mitigate the field instability effects of the mechanical cryocooler.

In some embodiments, the field instability caused by a mechanical cryocooler can be mitigated using an active compensation technique using imaging coils and digital processing. The spatial profile of the magnetic field produced by the regenerator material in the cryocooler will fall off roughly as a function of $1/r^3$, where r is distance from the cold head. The frequency of the field instability oscillations can be tracked and a combination of electromagnets within the bore of the magnetic resonance system (e.g., gradient and shim coils) can be used together with a demodulation frequency to reduce the effects of the oscillations.

As one example, adjustment of the demodulation frequency will remove the mean of the oscillation, applying the y-gradient with an oscillating frequency will remove a linear function of field oscillation, and applying the second order shim coils with an oscillating frequency will remove second order terms of the field instability. This combined approach removes most of the effect of the problem without the need for additional hardware that is not already present on the magnetic resonance system. It will be appreciated, however, that one or more of these mitigating features can be implemented alone or in combination depending on the type and severity of the field instability effects.

Figure 3:
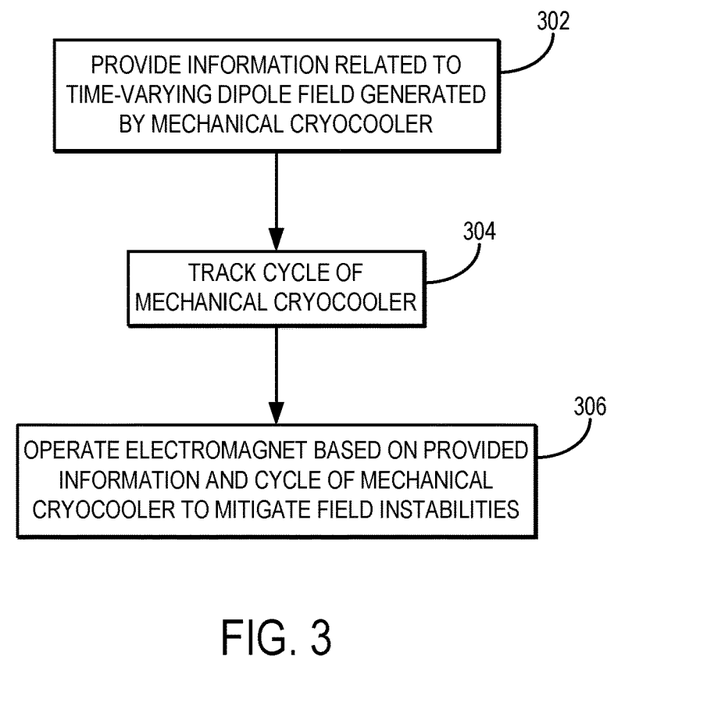
FIG. 3 is a flowchart setting forth the steps of an example method for controlling the shim and/or gradient coils in a magnetic resonance system to mitigate field instabilities caused by time-varying dipole fields generated by the cold head in a mechanical cryocooler.

Referring now to FIG. 3, a flowchart is illustrated as setting forth the steps of an example method for mitigating the field instability caused by a mechanical cryocooler using the shim coils, gradient coils, or both, of a magnetic resonance system. The method includes providing information related to the time-varying dipole field generated by the mechanical cryocooler, as indicated at step 302. In some instances, this information can be provided by measuring the dipole field generated by the mechanical cryocooler in operation. In some other instances, this information can be provided by simulating the dipole field that should be generated by the mechanical cryocooler in operation. Information related to the time-varying dipole field can include the frequency, magnitude, or both of the field. This information can be used to determine corrective electromagnetic fields that, when generated in the proximity of the cold head, will mitigate or otherwise eliminate the magnetic field instabilities caused by the time-varying dipole fields. In some instances, control parameters that define the operation of shim coils, gradient coils, or both, to generate the corrective electromagnetic fields are determined.

It is preferable to track the cycle of the mechanical cryocooler to time the application of electromagnetic fields generated by the shim coils, gradient coils, or both. Thus, the cycle of the mechanical cryocooler is tracked, as indicated at step 304.

As one example, the cycle of the cold head in the mechanical cryocooler can be tracked by measuring the dipole field as a function of time and identifying where in the stability cycle the cryocooler currently is operating. This measurement can be performed, for example, using the magnetic resonance system itself, or with a Hall probe, or the like, that is operably coupled to the cold head. In this instance, the information can be relayed back to the magnetic resonance system to appropriately drive the shim coils, gradient coils, or both.

As another example, the motor of the cold head pump can be tracked. The cycle of the motor can then be correlated with the dipole field to provide information about the cycle of the mechanical cryocooler as it relates to the dipole field being generated at a particular point in the cycle. In this instance, the information about the pump motor cycle can be relayed back to the magnetic resonance system to appropriately drive the shim coils, gradient coils, or both.

By tracking the cycle of the mechanical cryocooler and providing the information about the dipole field generated by the cryocooler, the magnetic resonance system's shim coils, gradient coils, or both can be operated in a manner such that one or more fields are generated that mitigate the field instability caused by the mechanical cryocooler, as indicated at step 306. As mentioned above, adjustment of the demodulation frequency will remove the mean of the oscillation, applying the y-gradient with an oscillating frequency will remove a linear function of field oscillation, and applying the second order shim coils with an oscillating frequency will remove second order terms of the field instability. Thus, using the information provided and obtained, as discussed above, the magnetic resonance system can be operated to actively compensate for the field instability effects of the mechanical cryocooler.

Figure 4:
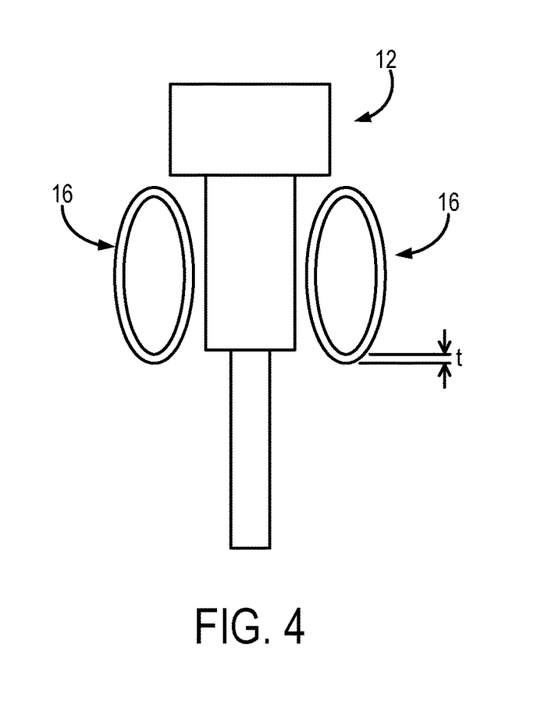
FIG. 4 depicts an example mechanical cryocooler with one or more passive compensation coils for mitigating field instabilities caused by time-varying dipole fields generated by the cold head.

In some embodiments, such as those illustrated in FIG. 4, the field instability caused by a mechanical cryocooler can be mitigated using one or more passively conducting loops 16 positioned near the cold head 12. As one example, conducting loops of wire, or other conducting material, could be placed near the base of the cold head. As the magnetic dipole changes in magnitude, a changing magnetic flux through the conducting material will be generated, and this changing flux will result in an induced current to oppose the flux change. The induced current will act to cancel the field produced by the dipole throughout space. The time-constant of the conducting loop (a function of its resistance and inductance) should preferably be long compared to the frequency of oscillation, which is about 1-1.2 Hz. Thus, the loop should be composed of an extremely low resistance material. As one example, the loop can be composed of thick cold copper.

For the passive conducting loops, the thickness of the conductor should be selected based on the skin depth for the conductor material at a driving frequency around the frequency of oscillation (e.g., around 1 Hz). For copper cooled below 7 K, the resistivity of the material is $2 \times 10^{-11}$ $\Omega$m. For a 1 Hz driving frequency, the skin depth of copper is about 2.83 cm. Therefore, to reduce the magnetic field by about sixty percent, the thickness, t, of the copper must be one skin depth thick. To completely eliminate the effect, the thickness, t, of the copper should be at least three skin depths thick (e.g., about 8.5 cm).

Figure 5:
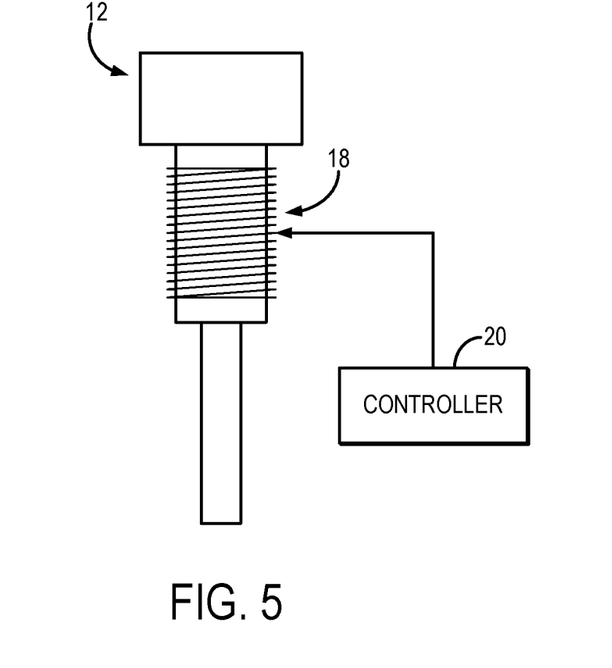
FIG. 5 depicts an example mechanical cryocooler with active shielding for mitigating field instabilities caused by time-varying dipole fields generated by the cold head.

In some embodiments, such as those illustrated in FIG. 5, the field instability caused by a mechanical cryocooler can be mitigated by actively shielding the cold head 12 with an active shielding 18 positioned proximate the cold head 12. Because the magnetic moment of the material depends on the magnitude of the external field, if the magnetic moments of the materials in the cold head are reduced the field instability effects will be reduced as well. The magnetic moment in the cold head materials can be reduced by shielding the magnetic field around the cold head with an active electromagnet 18 controlled by a controller 20. For instance, the active shielding can include designing the magnet windings to include the need for a region of low magnetic field around the cold head. In general, it is contemplated that the active shield can be designed based on the type of regenerator material in the mechanical cryocooler, the geometry of the mechanical cryocooler, the local magnetic field in which the mechanical cryocooler will be positioned, or combinations thereof. For instance, the design of the windings in the active shielding 18, the current waveforms through the active shielding 18, or both, are in general chosen based on the particular system. As an example, if only the regenerator material changed, then the same design of windings in the active shield 18 could be used, but the current waveform provided to the active shielding 18 could have a different amplitude depending on how the regenerator material magnetizes.

Figure 6:
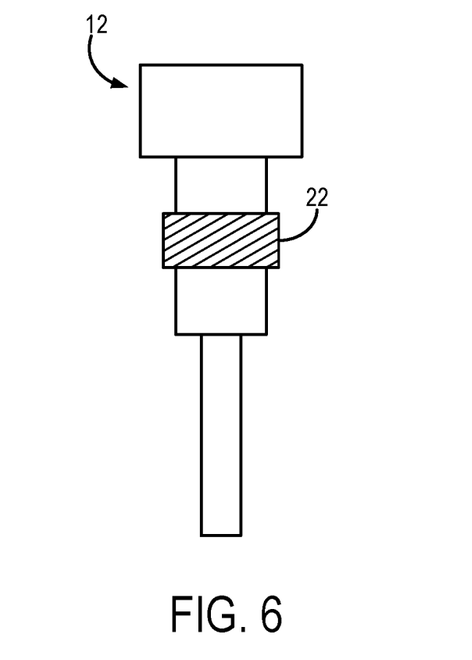
FIG. 6 depicts an example mechanical cryocooler with passive shielding for mitigating field instabilities caused by time-varying dipole fields generated by the cold head.

In some other embodiments, such as those illustrated in FIG. 6, the field instability caused by a mechanical cryocooler can be mitigated by passively shielding the cold head 12 with passive shielding 22. As one example, the passive shielding 22 can include a ferromagnetic material positioned around the cold head. As another example, the passive shielding 22 can include superconducting loops placed around the cold head, but not in series with the magnet windings. In this latter example, the superconducting loops will act to maintain zero magnetic flux through their center, but must be designed so that ramping to field will not cause these superconducting loops to exceed their critical current density.

Figure 7:
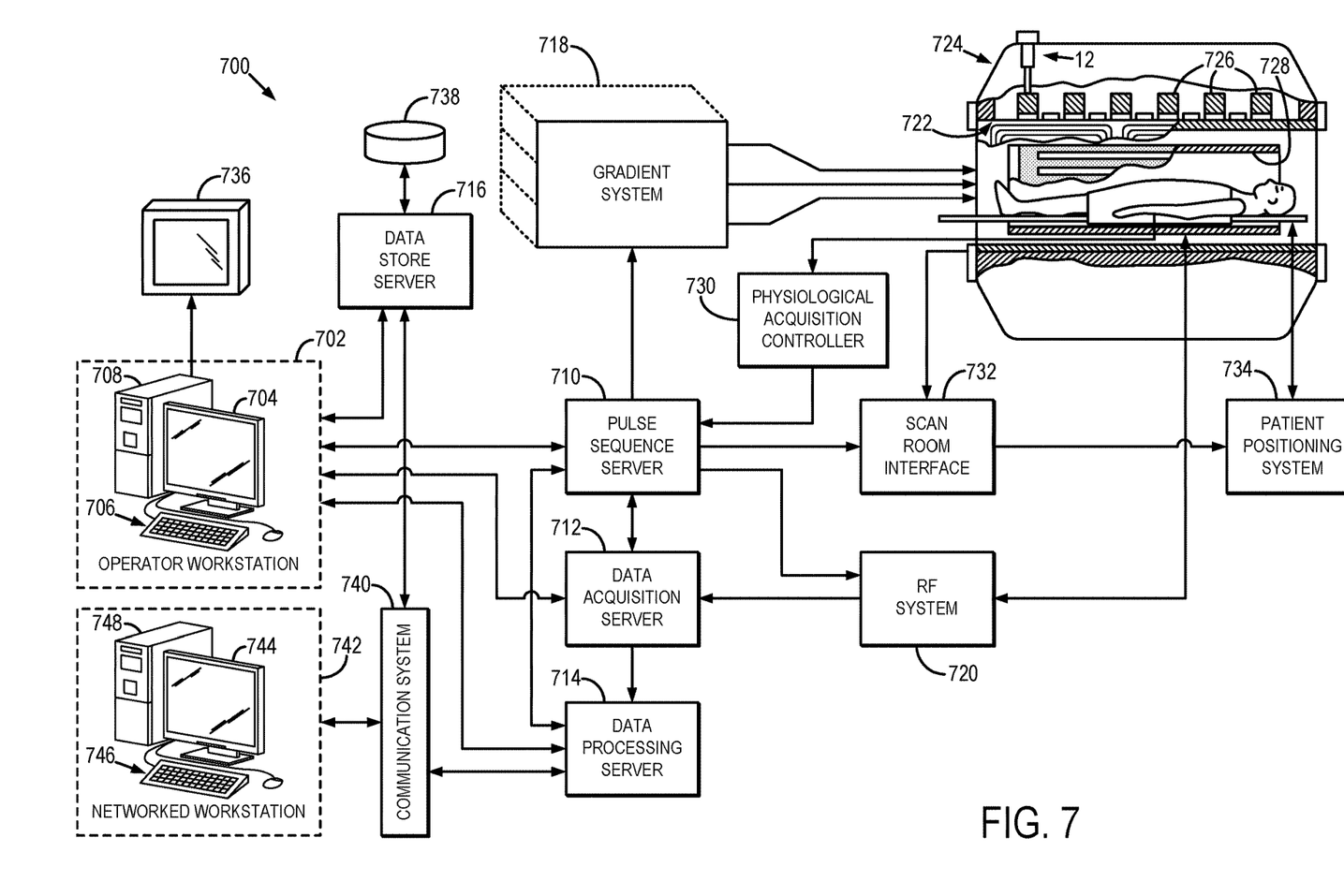
FIG. 7 is a block diagram of an example magnetic resonance imaging ("MRI") system, which may incorporate a mechanical cryocooler.

Referring particularly now to FIG. 7, an example of a magnetic resonance imaging ("MRI") system 700 is illustrated. The MRI system 700 includes an operator workstation 702, which will typically include a display 704; one or more input devices 706, such as a keyboard and mouse; and a processor 708. The processor 708 may include a commercially available programmable machine running a commercially available operating system. The operator workstation 702 provides the operator interface that enables scan prescriptions to be entered into the MRI system 700. In general, the operator workstation 702 may be coupled to four servers: a pulse sequence server 710; a data acquisition server 712; a data processing server 714; and a data store server 716. The operator workstation 702 and each server 710, 712, 714, and 716 are connected to communicate with each other. For example, the servers 710, 712, 714, and 716 may be connected via a communication system 740, which may include any suitable network connection, whether wired, wireless, or a combination of both. As an example, the communication system 740 may include both proprietary or dedicated networks, as well as open networks, such as the internet.

The pulse sequence server 710 functions in response to instructions downloaded from the operator workstation 702 to operate a gradient system 718 and a radiofrequency ("RF") system 720. Gradient waveforms necessary to perform the prescribed scan are produced and applied to the gradient system 718, which excites gradient coils in an assembly 722 to produce the magnetic field gradients $G_x$, $G_y$, and $G_z$ used for position encoding magnetic resonance signals. The gradient coil assembly 722 forms part of a magnet assembly 724 that includes a polarizing magnet 726 and a whole-body RF coil 728.

RF waveforms are applied by the RF system 720 to the RF coil 728, or a separate local coil (not shown in FIG. 7), in order to perform the prescribed magnetic resonance pulse sequence. Responsive magnetic resonance signals detected by the RF coil 728, or a separate local coil (not shown in FIG. 7), are received by the RF system 720, where they are amplified, demodulated, filtered, and digitized under direction of commands produced by the pulse sequence server 710. The RF system 720 includes an RF transmitter for producing a wide variety of RF pulses used in MRI pulse sequences. The RF transmitter is responsive to the scan prescription and direction from the pulse sequence server 710 to produce RF pulses of the desired frequency, phase, and pulse amplitude waveform. The generated RF pulses may be applied to the whole-body RF coil 728 or to one or more local coils or coil arrays (not shown in FIG. 7).

The RF system 720 also includes one or more RF receiver channels. Each RF receiver channel includes an RF preamplifier that amplifies the magnetic resonance signal received by the coil 728 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (1);$$

and the phase of the received magnetic resonance signal may also be determined according to the following relationship:

$$\varphi=\tan^{-1}(Q/I) \quad (2).$$

The pulse sequence server 710 also optionally receives patient data from a physiological acquisition controller 730. By way of example, the physiological acquisition controller 730 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 710 to synchronize, or "gate," the performance of the scan with the subject's heart beat or respiration.

The pulse sequence server 710 also connects to a scan room interface circuit 732 that receives signals from various sensors associated with the condition of the patient and the magnet system. It is also through the scan room interface circuit 732 that a patient positioning system 734 receives commands to move the patient to desired positions during the scan.

The digitized magnetic resonance signal samples produced by the RF system 720 are received by the data acquisition server 712. The data acquisition server 712 operates in response to instructions downloaded from the operator workstation 702 to receive the real-time magnetic resonance data and provide buffer storage, such that no data is lost by data overrun. In some scans, the data acquisition server 712 does little more than pass the acquired magnetic resonance data to the data processor server 714. However, in scans that require information derived from acquired magnetic resonance data to control the further performance of the scan, the data acquisition server 712 is programmed to produce such information and convey it to the pulse sequence server 710. For example, during prescans, magnetic resonance data is acquired and used to calibrate the pulse sequence performed by the pulse sequence server 710. As another example, navigator signals may be acquired and used to adjust the operating parameters of the RF system 720 or the gradient system 718, or to control the view order in which k-space is sampled. In still another example, the data acquisition server 712 may also be employed to process magnetic resonance signals used to detect the arrival of a contrast agent in a magnetic resonance angiography ("MRA") scan. By way of example, the data acquisition server 712 acquires magnetic resonance data and processes it in real-time to produce information that is used to control the scan.

The data processing server 714 receives magnetic resonance data from the data acquisition server 712 and processes it in accordance with instructions downloaded from the operator workstation 702. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 714 are conveyed back to the operator workstation 702 where they are stored. Real-time images are stored in a data base memory cache (not shown in FIG. 7), from which they may be output to operator display 702 or a display 736 that is located near the magnet assembly 724 for use by attending physicians. Batch mode images or selected real time images are stored in a host database on disc storage 738. When such images have been reconstructed and transferred to storage, the data processing server 714 notifies the data store server 716 on the operator workstation 702. The operator workstation 702 may be used by an operator to archive the images, produce films, or send the images via a network to other facilities.

The MRI system 700 may also include one or more networked workstations 742. By way of example, a networked workstation 742 may include a display 744; one or more input devices 746, such as a keyboard and mouse; and a processor 748. The networked workstation 742 may be located within the same facility as the operator workstation 702, or in a different facility, such as a different healthcare institution or clinic.

The networked workstation 742, whether within the same facility or in a different facility as the operator workstation 702, may gain remote access to the data processing server 714 or data store server 716 via the communication system 740. Accordingly, multiple networked workstations 742 may have access to the data processing server 714 and the data store server 716. In this manner, magnetic resonance data, reconstructed images, or other data may be exchanged between the data processing server 714 or the data store server 716 and the networked workstations 742, such that the data or images may be remotely processed by a networked workstation 742. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for reducing effects of magnetic field instabilities caused by time-varying dipole fields generated by oscillations of a cold head in a mechanical cryocooler in a magnetic resonance system, the steps of the method comprising:
    (a) determining a spatial profile for the magnetic field instabilities caused by time-varying dipole fields generated by oscillations of the cold head in the mechanical cryocooler;
    (b) determining with a computer system and based in part on the determined spatial profile for the magnetic field instabilities, control parameters associated with at least one corrective electromagnetic field that when generated will reduce the magnetic field instabilities caused by the time-varying dipole fields generated by oscillations of the cold head in the mechanical cryocooler;
    (c) tracking a cycle of the mechanical cryocooler;
    (d) generating at a time point determined by the cycle of the mechanical cryocooler and using the control parameters, the at least one corrective electromagnetic field, thereby reducing the magnetic field instabilities caused by the time-varying dipole fields generated by oscillations of the cold head in the mechanical cryocooler; and
    (e) acquiring data with the magnetic resonance while adjusting a demodulation frequency of the magnetic resonance system based on a frequency of the time-varying dipole fields to remove a mean of the magnetic field instabilities.

2. The method as recited in claim 1, wherein the at least one corrective electromagnetic field is generated by operating an electromagnet positioned proximate a cold head of the mechanical cryocooler.

3. The method as recited in claim 2, wherein the electromagnet is designed based in part on the determined spatial profile for the magnetic field instabilities caused by time-varying dipole fields generated by oscillations of the cold head in the mechanical cryocooler.

4. The method as recited in claim 1, wherein the at least one corrective electromagnetic field is generated by operating at least one of a shim coil or a gradient coil that forms a part of the magnetic resonance system.

5. The method as recited in claim 4, wherein at least one of the gradient coils is operated to generate a magnetic field at a frequency of the time-varying dipole fields to remove a linear function of the magnetic field instabilities.

6. The method as recited in claim 4, wherein at least one of the shim coils is operated to generate a magnetic field at a frequency of the time-varying dipole fields to remove second order terms of the magnetic field instabilities.

7. The method as recited in claim 1, wherein step (c) includes measuring the time-varying dipole field to track the cycle of the mechanical cryocooler.

8. The method as recited in claim 1, wherein step (c) includes monitoring a cycle of a pump motor of the mechanical cryocooler.

9. The method as recited in claim 1, wherein the mechanical cryocooler is one of a Gifford-McMahon cryocooler or a pulse tube cryocooler.

* * * * *